United States Patent
Wang

(10) Patent No.: US 11,972,320 B1
(45) Date of Patent: Apr. 30, 2024

(54) CRYOGENIC POWER SUPPLY

(71) Applicant: PSIQUANTUM, CORP., Palo Alto, CA (US)

(72) Inventor: Albert Wang, Sunnyvale, CA (US)

(73) Assignee: Psiquantum, Corp., Palo Alto, CA (US)

(*) Notice: Subject to any disclaimer, the term of this patent is extended or adjusted under 35 U.S.C. 154(b) by 817 days.

(21) Appl. No.: 17/112,794

(22) Filed: Dec. 4, 2020

Related U.S. Application Data

(60) Provisional application No. 62/943,583, filed on Dec. 4, 2019.

(51) Int. Cl.
  *H10N 69/00* (2023.01)
  *G06N 10/00* (2022.01)
  *G06N 10/40* (2022.01)
  *H10N 60/81* (2023.01)
  *H10N 60/80* (2023.01)

(52) U.S. Cl.
  CPC ............ *G06N 10/00* (2019.01); *G06N 10/40* (2022.01); *H10N 60/81* (2023.02); *H10N 69/00* (2023.02); *H10N 60/805* (2023.02)

(58) Field of Classification Search
  CPC ......... H10N 69/00; H10N 60/805–815; G06N 10/00; G06N 10/40
  See application file for complete search history.

(56) References Cited

U.S. PATENT DOCUMENTS

| | | | |
|---|---|---|---|
| 11,107,799 B1* | 8/2021 | Alapati | H01L 23/481 |
| 11,493,713 B1* | 11/2022 | Mendoza | G06N 10/00 |
| 11,493,714 B1* | 11/2022 | Mendoza | G02B 6/12002 |
| 2013/0184159 A1* | 7/2013 | Forsyth | H02H 7/001 361/19 |
| 2018/0196196 A1* | 7/2018 | Byrd | G02B 6/14 |
| 2020/0013699 A1* | 1/2020 | Liu | H01L 24/80 |

* cited by examiner

*Primary Examiner* — Patrick O Neill
(74) *Attorney, Agent, or Firm* — Kilpatrick Townsend & Stockton LLP

(57) ABSTRACT

A quantum device includes a cryogenic chamber and a quantum computing module positioned within the cryogenic chamber. The quantum computing module includes a silicon substrate and a quantum circuit (QC) die including a qubit integrated circuit. The QC die is attached to the silicon substrate. An electronic circuit (EC) die including an electronic integrated circuit is attached to the QC die such that the qubit integrated circuit and the electronic integrated circuit face each other. The QC die can be fusion bonded to the EC die. A circuit board (CB) includes a power converter configured to convert input power received from a cryogenic chamber feedthrough to output power that is coupled to the QC die and to the EC die.

20 Claims, 12 Drawing Sheets

CRYOGENIC POWER SUPPLY

CROSS-REFERENCES TO OTHER APPLICATIONS

This application claims priority to U.S. provisional patent application Ser. No. 62/943,583, for "CRYOGENIC POWER SUPPLY" filed on Dec. 4, 2019 which is hereby incorporated by reference in entirety for all purposes.

FIELD

The described embodiments relate generally to quantum computing. More particularly, the present embodiments relate to electrical power supplies that are configured to operate within a cryogenic environment to supply power to quantum computing devices operating at cryogenic temperatures.

BACKGROUND

Currently numerous types of quantum computing circuits are being actively developed. Many of these quantum computing circuits require operation at low temperatures in the tens of degrees Kelvin to the milli-degrees Kelvin to achieve requisite levels of thermal noise. Often, the quantum computing circuits are directly coupled to a cold head of a multi-stage cryogenic chamber resulting in limited accessibility to the circuit. Power bus wires supply power to the quantum computing circuit and are coupled from the external environment to the internal cryogenic environment, creating "thermal leaks" into the cryogenic environment. In addition, a length of the power bus wires can create an undesirably large parasitic capacitance and inductance between the external power source and the quantum computing circuit. New power delivery architectures and solutions are needed for quantum computing circuits that operate at low temperatures.

SUMMARY

In some embodiments a device comprises a cryogenic chamber and a quantum computing module positioned within the cryogenic chamber. The quantum computing module includes a silicon substrate and a quantum circuit (QC) die including a qubit integrated circuit, wherein the QC die is attached to the silicon substrate. An electronic circuit (EC) die includes an electronic integrated circuit, wherein the EC die is attached to the QC die such that the qubit integrated circuit and the electronic integrated circuit face each other. A circuit board (CB) includes a power converter configured to convert input power received from a cryogenic chamber feedthrough to output power that is coupled to the QC die and to the EC die. In various embodiments the power converter supplies the output power to the QC die through the EC die.

In some embodiments the EC die includes at least one through silicon via that couples the output power from the power converter to the QC die. In various embodiments the EC die includes at least one through silicon via that couples the output power from the power converter to the electronic integrated circuit. In some embodiments the QC die and the EC die are fusion bonded together. In various embodiments the quantum circuit die is a photonic integrated circuit. In some embodiments the CB is physically coupled to the silicon substrate. In various embodiments the CB is physically coupled to the EC die.

In some embodiments a device comprises a cryogenic chamber and a power source positioned outside of the cryogenic chamber. A feedthrough is positioned within a wall of the cryogenic chamber. A quantum module is positioned within the cryogenic chamber and includes a silicon substrate and a quantum circuit (QC) die including a qubit integrated circuit, wherein the QC die is attached to the silicon substrate. An electronic circuit (EC) die includes an electronic integrated circuit electrically coupled to the qubit integrated circuit, wherein the EC die is physically attached to the QC die. A circuit board (CB) includes a power converter configured to convert input power received from the feedthrough to one or more DC voltages that are electrically coupled to the qubit integrated circuit and to the electronic integrated circuit.

In some embodiments the power converter supplies the one or more DC voltages to the qubit integrated circuit die through the EC die. In various embodiments the EC die includes at least one through silicon via that couples at least one of the one or more DC voltages from the power converter to the qubit integrated circuit. In some embodiments the EC die includes at least one through silicon via that couples at least one of the one or more DC voltages from the power converter to the electronic integrated circuit. In various embodiments the QC die and the EC die are fusion bonded together. In some embodiments the quantum circuit die is a photonic integrated circuit. In various embodiments the CB is physically coupled to the silicon substrate. In some embodiments the CB is physically coupled to the EC die.

In some embodiments a method comprises coupling electrical power into a cryogenic chamber through a feedthrough and converting the electrical power to one or more DC voltages with a power converter positioned within the cryogenic chamber. A quantum module is positioned within the cryogenic chamber and is operated using the one or more DC voltages. The quantum module includes a silicon substrate and a quantum circuit (QC) die including a qubit integrated circuit, wherein the QC die is attached to the silicon substrate. An electronic circuit (EC) die includes an electronic integrated circuit electrically coupled to the qubit integrated circuit, wherein the EC die is physically attached to the QC die. A circuit board (CB) includes a power converter formed on the CB.

In some embodiments the power converter is coupled to the QC die through the EC die. In various embodiments the EC die includes at least one through silicon via that couples the electrical power from the power converter to the qubit integrated circuit.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION

Figure 1:
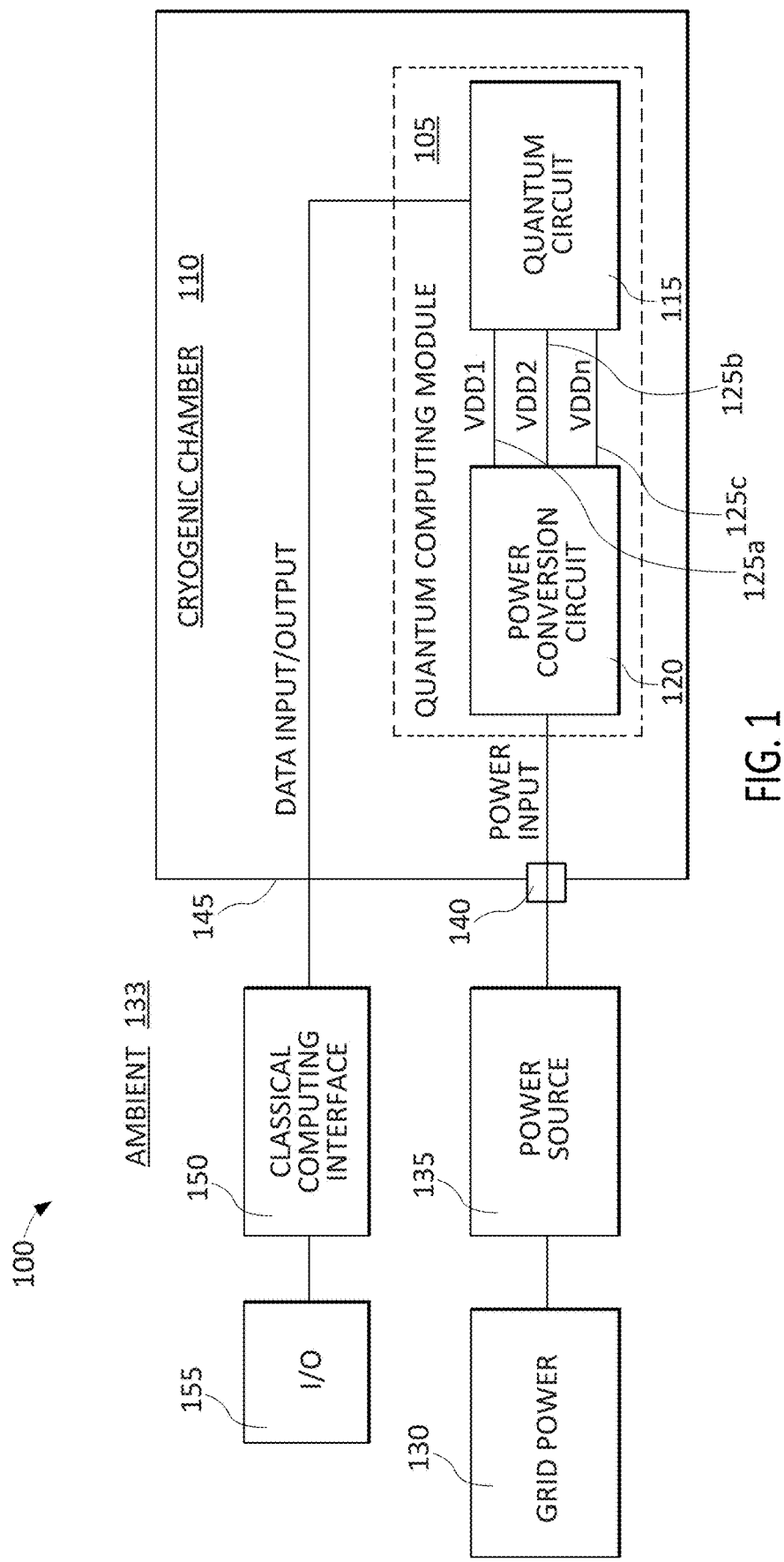
FIG. 1 illustrates a simplified block diagram of a quantum computing device including a power supply positioned within a cryogenic chamber, according to some embodiments of the disclosure.

Techniques disclosed herein relate generally to power supplies for quantum computing devices that operate within a cryogenic environment. More specifically, techniques disclosed herein relate to power supplies that are configured to be positioned at least partially within the same cryogenic environment as the quantum computing device. Electrical power is transferred from an external environment to an internal environment of a cryogenic chamber via one or more feedthroughs. In some embodiments the electrical power can be transferred inside of the cryogenic environment using alternating current (AC) while in other embodiments the electrical power can be transferred using direct current (DC). In either case, power can be transferred into the cryogenic chamber using a relatively high voltage to minimize conductor heating and/or conductor size/quantity. The reduced number of and/or size of wires provides more physical space for feeding the number of requisite wires through the cryogenic chamber to the quantum computing device. In addition, a reduced cross-sectional area of wires reduces the thermal leakage from the external environment to the internal environment, as wires act as heat conductors into the cryogenic chamber. Further, integrating at least a final stage of the power converter within the quantum computing device, proximate the quantum computing circuit, reduces parasitic inductance and capacitance of the electrical conductors enabling the power supply to better respond to transient load requirements of the quantum computing circuit.

For example, in one embodiment a quantum computing module includes a silicon substrate attached to a cold head of the cryogenic chamber. A quantum circuit die including a qubit integrated circuit is attached to the silicon substrate. An electronic circuit die that includes one or more electronic integrated circuits is attached to the quantum circuit die. A circuit board (CB) can be attached to the silicon substrate and includes an integrated power converter. The integrated power converter converts power received from a feedthrough in a wall of the cryogenic chamber to one or more DC voltages that are coupled to the quantum circuit die and to the electronic circuit die.

Several illustrative embodiments will now be described with respect to the accompanying drawings, which form a part hereof. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

FIG. 1 illustrates a simplified block diagram of a quantum computing device 100, according to some embodiments of the disclosure. As shown in FIG. 1, a quantum computing module 105 is located within a cryogenic chamber 110 that can be maintained at a temperature in the low or milli-degrees Kelvin. Quantum computing module 105 includes a quantum circuit 115 and a power conversion circuit 120 that supplies one or more DC supply voltages 125a, 125b, 125c power to the quantum circuit. Grid power 130 (e.g., AC power from the local power utility) is delivered to a power source 135 that is external to cryogenic chamber 110 in an ambient environment 133. Power source 135 can perform conditioning, filtering, protection, isolation, regulation and/or conversion of grid power 130. Power conversion circuit 120 receives power from power source 135 via a feedthrough 140 that is in a wall 145 of cryogenic chamber 110.

In some embodiments power source 135 delivers AC power through feedthrough 140 to power conversion circuit 120 and the power conversion circuit converts the AC power to DC power at one or more supply voltages 125a, 125b, 125c. In other embodiments power source 135 is configured to deliver DC power through feedthrough 140 to power conversion circuit 120 and the power conversion circuit converts the DC power to one or more DC supply voltages 125a, 125b, 125c for quantum circuit 115. In various embodiments power source 135 can be configured to supply a relatively high voltage (e.g., above 40 volts, above 100 volts or above 200 volts AC or DC) to power conversion circuit 120 to minimize the number of and/or size of electrical conductors passing through feedthrough 140, as opposed to passing each individual supply voltage 125a, 125b, 125c through the feedthrough. More specifically, by using a relatively high voltage power source 135 to transfer power from ambient environment 133 to cryogenic chamber 110, a fewer number of bus wires and/or a reduced total cross-sectional area of bus wires can be used to pass an equivalent amount of energy to quantum circuit 115 as compared to a relatively lower voltage power source. The reduced number of wires reduces not only the physical area required to feed the wires through cryogenic chamber 110, but also reduces the total cross-sectional area of electrical conductors that operate as thermal conductors leaking thermal energy to the interior of the chamber.

In this particular embodiment, power conversion circuit 120 is located proximate quantum circuit 115, enabling the power conversion circuit to provide efficient and responsive power to the quantum circuit. More specifically, in some embodiments one or more portions of quantum circuit 115 may have dynamically changing power requirements in terms of voltage and/or current with respect to time and by locating power conversion circuit 120 proximate the quantum circuit (i.e., within cryogenic chamber 110) the parasitic inductance and capacitance between the power conversion circuit and the quantum circuit can be reduced as compared to positioning the power conversion circuit outside of the cryogenic chamber. In some embodiments, to further reduce the parasitics, some or all of the power conversion system can be located within the same cryogenic stage of cryogenic chamber 110 as quantum circuit 115. Further, by positioning power conversion circuit 120 within cryogenic chamber 110, plurality of supply voltages 125a, 125b, 125c can be produced from one power input, reducing the number of conductors that pass through feedthrough 140. Although only three supply voltages are shown in FIG. 1, other embodiments can have a greater number of individual supply voltages.

In some embodiments quantum computing device 100 also has a classical computing interface 150 that communicates input and output (I/O) 155 with quantum circuit 115. Classical computing interface 150 can be used to provide command, control, readout and telemetry functions of quantum circuit 115. In some embodiments I/O 155 may be electrical or optical data communication lines that transfer "data" into and out of quantum circuit 115 as compared to the power conversion system that delivers power to the quantum circuit that is needed for the quantum circuit to operate.

A person of skill in the art, with the benefit of this disclosure, will appreciate that, in some embodiments, power source 135 can include an AC to AC converter, an AC to DC converter in series with a DC to AC converter, an AC to DC converter, or any other suitable combination of power conversion circuits. Power source 135 and power conversion circuit 120 can include any suitable power conversion circuit and/or circuit architecture including analog or digital-based conversion circuits that include but are not limited to, a transformer, a flyback converter, a buck converter, a boost converter, a buck-boost converter, a linear converter, a voltage divider a SEPIC converter, a step-down converter, a step-up converter, a half-bridge circuit architecture or a full-bridge circuit architecture.

A person of skill in the art, with the benefit of this disclosure, will also appreciate that, in some embodiments that solid-state semiconductor switches can be used to form one or more of the power converters and can be formed from gallium-nitride (GaN), silicon, indium phosphide (InP), gallium arsenide (GaAs), silicon carbide (SiC), sapphire or diamond-based devices.

In some embodiments a plurality of quantum computing devices 100 can be communicatively coupled together to form a quantum computer. In further embodiments, as described in more detail herein, quantum circuit 115, can also include an electronic circuit that controls operation of a qubit integrated circuit. In one embodiment a quantum circuit (QC) die includes a qubit integrated circuit and an electronic circuit (EC) die includes one or more electronic integrated circuits. The QC die can be physically and electrically coupled to the EC die (e.g., with fusion bonding). In further embodiments the electronic integrated circuit and the qubit integrated circuit may be monolithically formed on one semiconductor substrate.

QC die and qubit integrated circuit can generate, process and/or detect qubits of any type including, but not limited to atoms, ions, photons, vibrations or electrons. In some embodiments QC die and qubit integrated circuit are specifically configured to generate, process and/or detect photons and may be described as a photonic die having a photonic integrated circuit.

Figure 2:
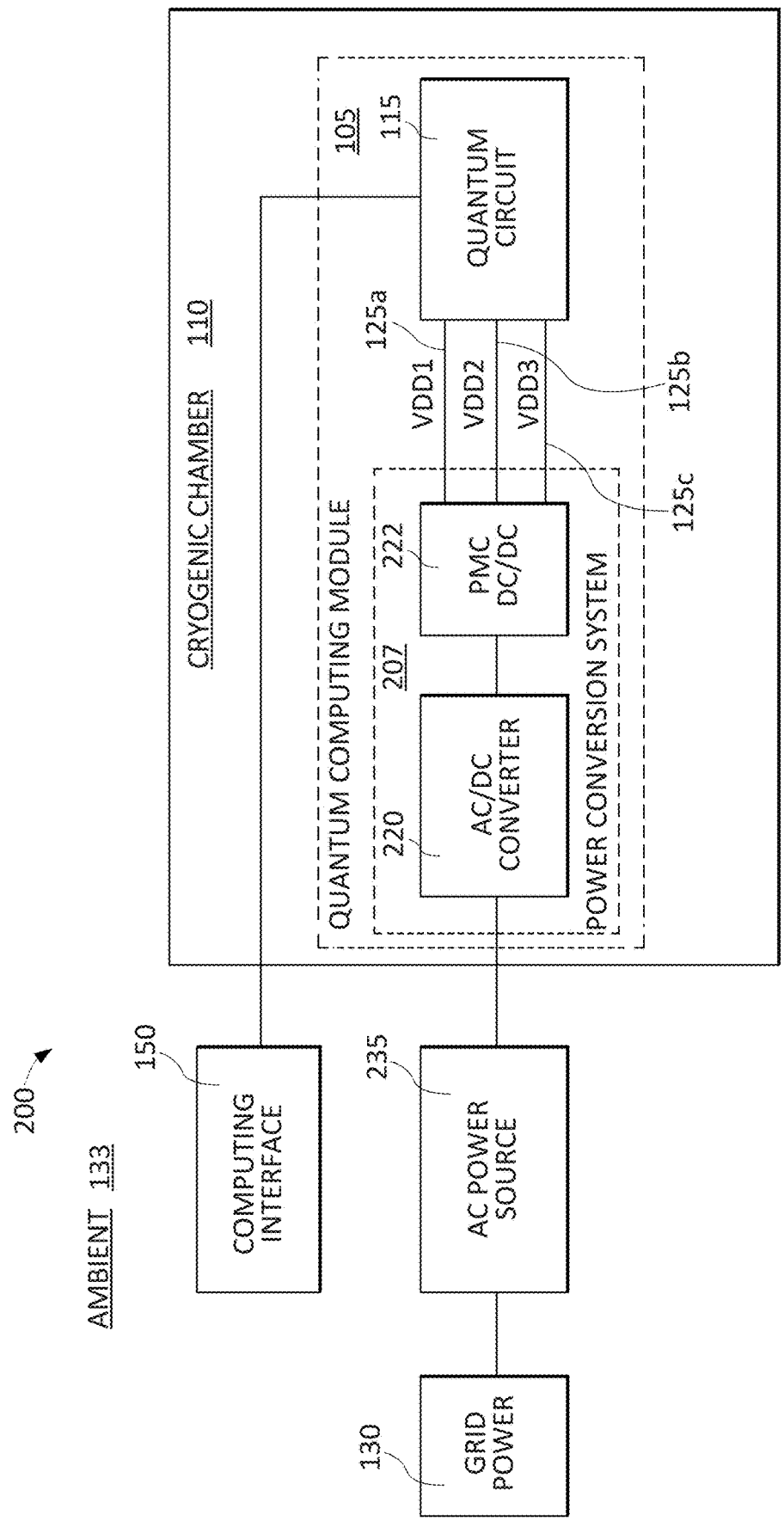
FIG. 2 illustrates a simplified block diagram of a quantum computing device including a power supply having an AC source positioned outside of a cryogenic chamber and an AC to DC converter positioned within the cryogenic chamber, according to embodiments of the disclosure.

FIG. 2 illustrates a simplified block diagram of a quantum computing device 200 that is similar to quantum computing device 100 shown in FIG. 1, however quantum computing device 200 uses an AC power source and an AC to DC power conversion system that includes a power management circuit, according to embodiments of the disclosure. As shown in FIG. 2, AC power source 235 delivers AC power to power conversion system 207 that is positioned within cryogenic chamber 110. Power conversion system 207 includes an AC to DC converter 220 in series with a power management circuit (PMC) 222 that includes at least one DC to DC converter. In some embodiments AC to DC converter 220 can convert the AC power (e.g., 110 VAC, 220 VAC, 440 VAC) supplied by AC power source 235 to DC power (e.g., 12, VDC, 48 VDC, 100 VDC) and deliver the DC power to power management circuit 222. Power management circuit 222 can include a plurality of DC to DC converters that each convert the DC power to a number of DC voltages needed by the quantum circuit (e.g., VDD1=1.3 VDC, VDD2=2.5 VDC, VDD3=5 VDC). In some embodiments power management circuit 222 can be integrated within a single electronic device (e.g., co-packaged) while in other embodiments each DC to DC converter can be a discrete and separate circuit (e.g., multiple electronic packages).

The AC and DC voltages described herein are examples of suitable voltages and one of skill in the art having the benefit of this disclosure would appreciate that any suitable AC and DC voltages could be used. It will also be appreciated that there is a relationship between higher voltages and smaller wire diameter and/or fewer wires that can improve certain aspects of the quantum computing device as described herein.

Figure 3:
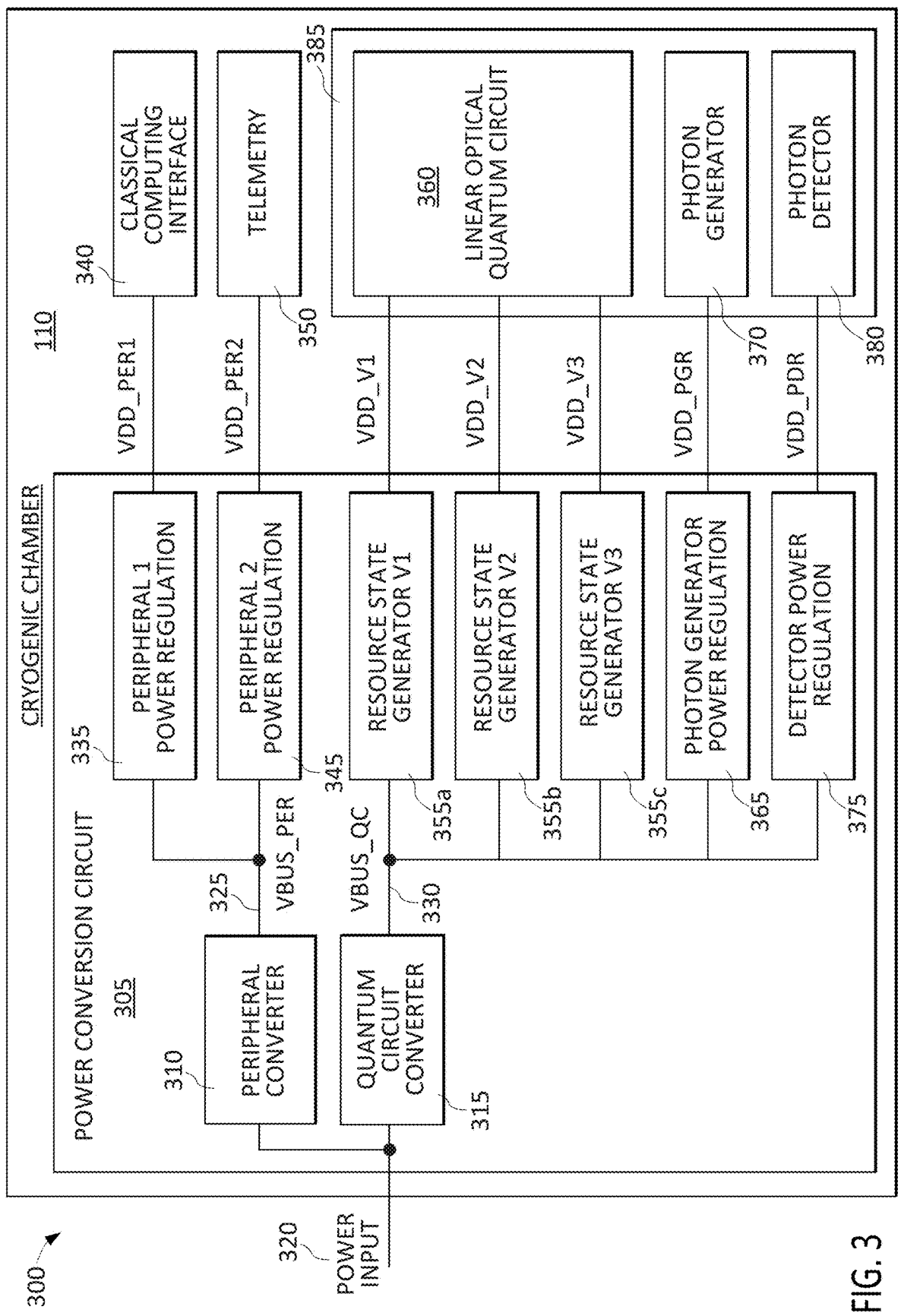
FIG. 3 illustrates a simplified block diagram of a quantum computing device power supply that has a peripheral bus and a quantum circuit bus that are generated within a cryogenic chamber, according to embodiments of the disclosure.

FIG. 3 illustrates a simplified block diagram of a quantum computing device 300 that is similar to quantum computing devices 100 and 200 shown in FIGS. 1, and 2, respectively, however quantum computing device 300 includes a power conversion circuit 305 that has both a peripheral power converter 310 and a quantum circuit power converter 315, according to embodiments of the disclosure. As shown in FIG. 3, power conversion circuit 305 can convert input power 320 that is received from an external power source (e.g., power source 135 in FIG. 1) or from an upstream converter positioned within cryogenic chamber 110 (e.g., AC/DC converter 220 in FIG. 2) to a first DC bus rail 325 that is for peripherals (e.g., VBUS PER) and a second DC bus rail 330 that is for quantum circuit (e.g., VBUS QC). In some embodiments first and second bus rails 325, 330, respectively, can be a same DC voltage and/or current while in other embodiments they can be different DC voltages and/or currents.

First bus rail 325 (e.g., VBUS PER) can supply a first peripheral power regulation circuit 335 with power to generate a DC supply voltage (e.g., VDD_PER1) for classical computing interface 340. First bus rail 325 can also supply a second peripheral power regulation circuit 345 with power to generate a DC supply voltage (e.g., VDD_PER2) for telemetry 350, that can be used to provide feedback regarding the operation of one or more systems within cryogenic chamber 110.

Second bus rail 330 (e.g., VBUS QC) can supply a plurality of resource state generator regulation circuits 355a, 355b, 355c with power to generate a first DC supply voltage (e.g., VDD_V1), a second DC supply voltage (VDD_V2) and a third DC supply voltage (e.g., VDD_V3) for linear optical quantum circuit (LOQC) 360. In some embodiments first, second and third supply voltages can each be a different voltage and can have different regulation requirements. Second bus rail 330 can also supply a photon generator power regulation circuit 365 with power to generate a DC supply voltage (e.g., VDD PGR) for a photon generator 370. Second bus rail 330 can supply a detector power regulation circuit 375 with power to generate a DC supply voltage (e.g., VDD PDR) for a photon detector 380. Each generated voltage can have different voltage, current, total power and/or transient power requirements to meet the needs of each circuit of quantum computing circuit 385.

Figure 4:
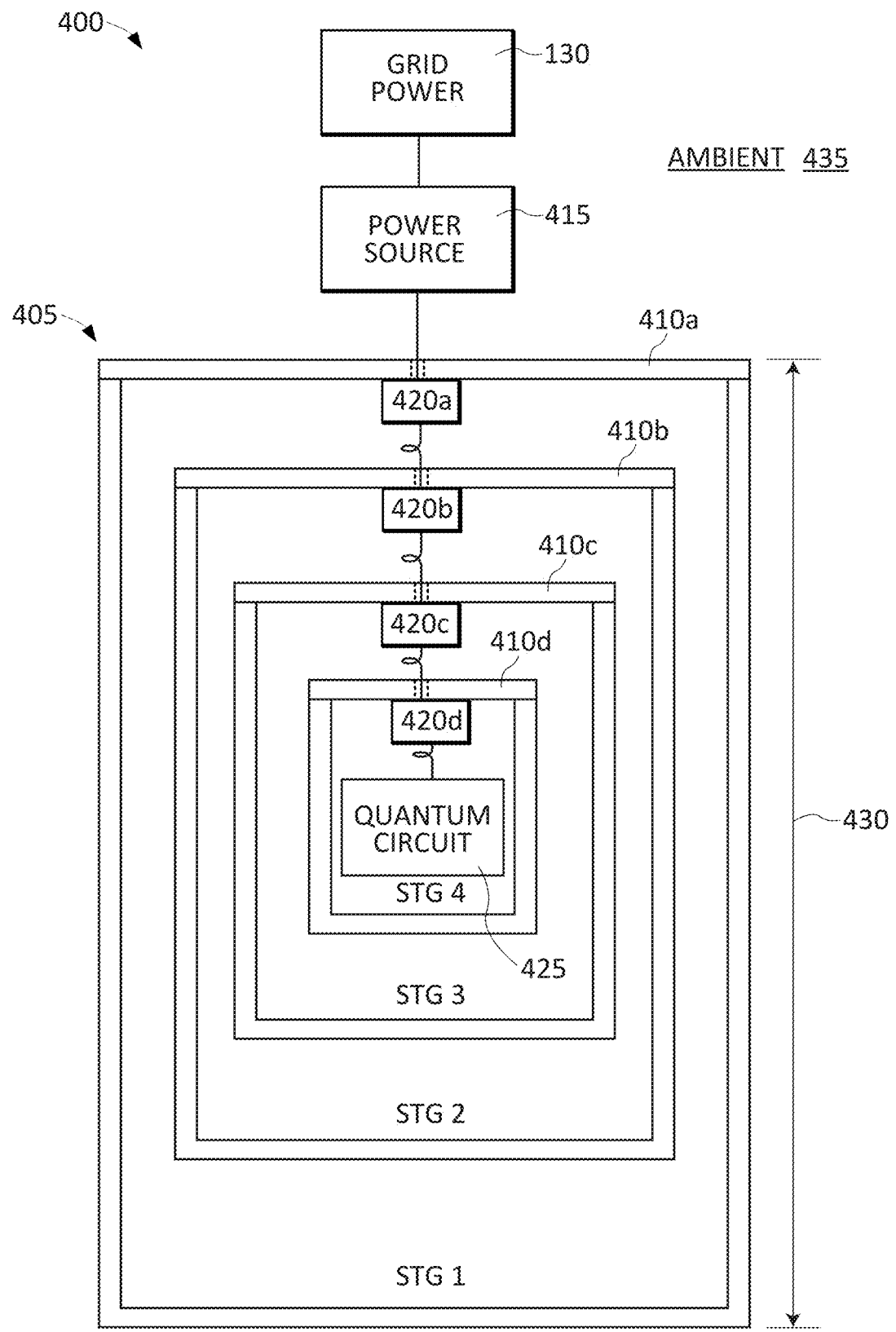
FIG. 4 illustrates a simplified diagram of a quantum circuit and a power supply that are positioned within a cryogenic chamber, according to embodiments of the disclosure.

FIG. 4 illustrates a simplified diagram of a quantum computing device 400, according to embodiments of the disclosure. As shown in FIG. 4, this example embodiment of a cryogenic chamber 405 includes four nested sequential cryogenic chamber stages 410a-410d that decrease in temperature from stage 1 410a (e.g., exterior stage) to stage 4 410d (e.g., interior stage), however other embodiments can have a different number of cryogenic chamber stages. Power source 415 supplies power to a series of serially connected power converters 420a, 420b, 420c, 420d that are distributed across a plurality of chambers of cryogenic chamber stages 410a-410d. In some embodiments first power converter 420a can be an AC to DC converter, second power converter 420b can be a first DC to DC converter at a first voltage, third power converter 420c can be second DC to DC converter at a second voltage and fourth power converter 420d can be a third DC to DC converter at a third voltage. As appreciated by one of skill in the art having the benefit of this disclosure, each power converter 420a-420d, can have other functions as described herein, for example second power converter 420b can also be an AC to DC converter.

In some embodiments, distributing sequential power converters 420a-420d in different cryogenic chamber stages 410a-410d can improve the efficiency of the last power converter 420d to minimize power dissipation within the coldest region (e.g., stage 4, 410d) of cryogenic chamber 405. In some embodiments the last power converter may be power converter 420c in stage 3 410c and only bus voltages may be passed through to quantum circuit 425 in stage 4 410d to minimize power dissipation within stage 4. In other embodiments a single voltage bus may be passed from third power converter 420c in stage 3 410c to fourth power converter 420d in stage 4 410d to minimize thermal leakage, and the various different voltages used by quantum circuit 425 may be generated within stage 4 410d. In some embodiments a length 430 of cryogenic chamber 405 can be between 0.5 meters to 10 meters and in some embodiments between 1 meter and 3 meters and in one embodiment approximately 2 meters.

In some embodiments all or a portion of power converters 420a-420d illustrated in FIG. 4 can be located within stage 4 410d, stage 3 410c, stage 2 410b and/or stage 1 410a. The power dissipation from each power converter along with the transient requirements of quantum circuit 425 and the thermal leakage of the various portions of the power conversion system can be optimized based on the location of each power converter in each cryogenic chamber stage.

In some embodiments an ambient environment 435 outside of cryogenic chamber 405 can be at approximately 300 K. In various embodiments the temperature within stage 1 410a can be approximately 77 K, the temperature within stage 2 410b can be approximately 4 K, the temperature within stage 3 410c can be approximately 1 K and the temperature within stage 4 410d can be less than 1 K. The aforementioned temperatures are merely for the sake of illustration and any suitable temperatures can be used.

Figure 5C:
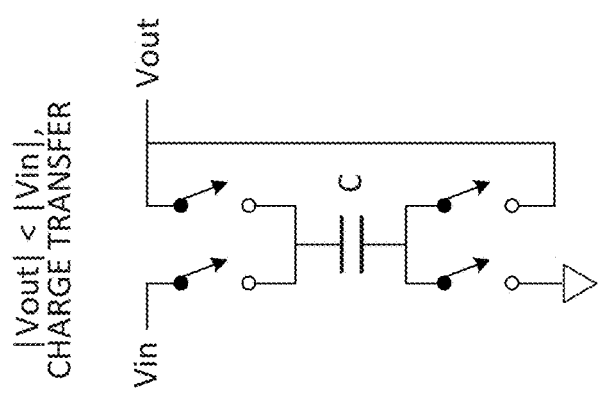
FIGS. 5A-5F illustrate simplified schematics of various power converter circuits that can be used for one or more portions of the power supply circuits described in FIGS. 1-4.
Figure 5B:
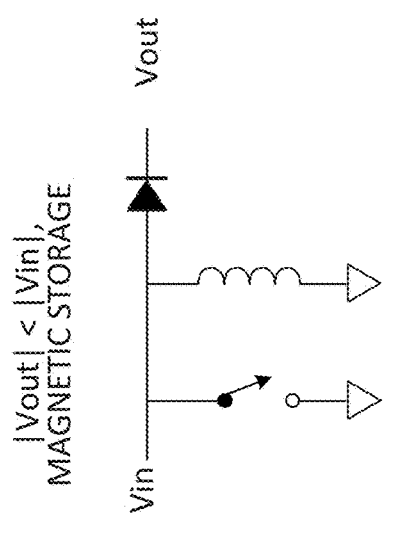
Figure 5A:
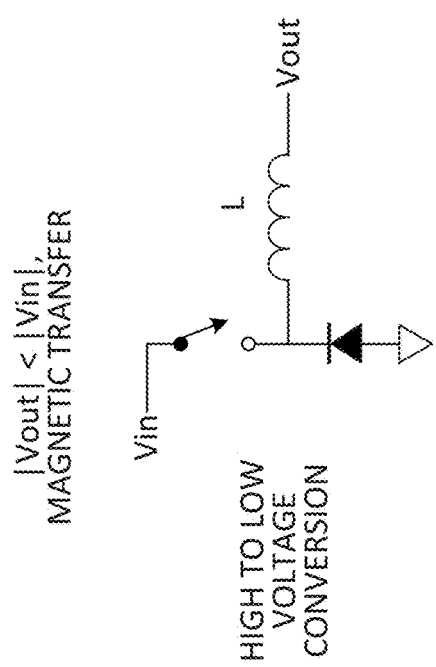
Figure 5F:
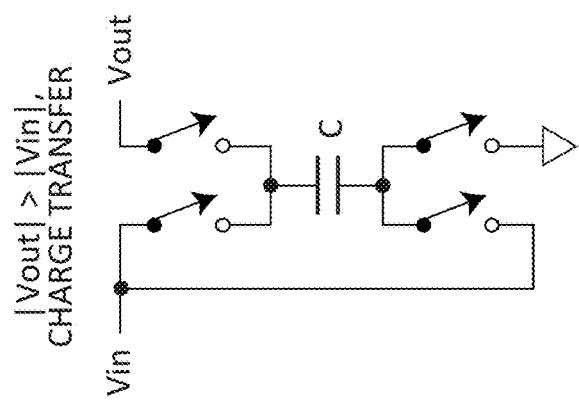
Figure 5E:
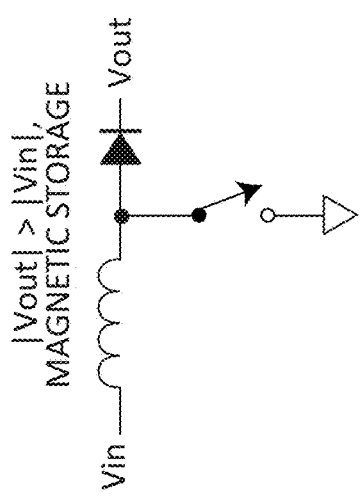
Figure 5D:
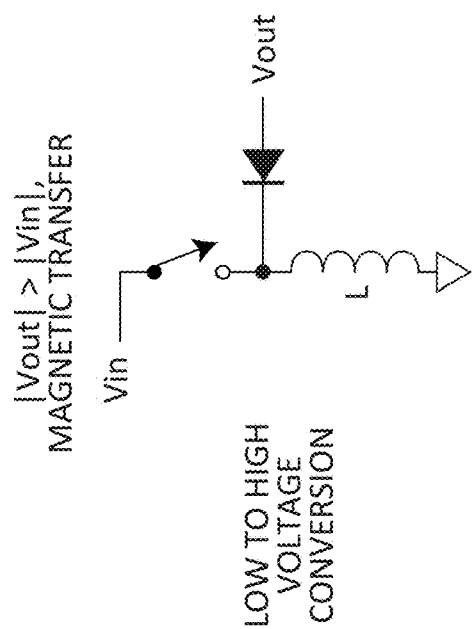

FIGS. 5A-5F illustrate simplified schematics of different power converter circuits that can be used for one or more portions of the power conversion circuits illustrated in FIGS. 1-4. As shown in FIGS. 5A-5C, these circuits can be used for converting a given input voltage to a lower output voltage. As shown in FIGS. 5D-5F, these circuits can be used for converting a given input voltage to a higher output voltage. The power converter circuits illustrated in FIGS. are for example only and other power converter circuits can be used and are within the scope of this disclosure. For example a synchronous DC to DC buck type converter can be used that operates with zero voltage switching to minimize switching related losses and maximize the efficiency of the converter to minimize power dissipation within the cryogenic chamber.

In some embodiments the circuitry of the power conversion system can be optimized for cryogenic operation. Power regulation circuits can use predominantly two types of components including energy storage elements and switches. Energy storage elements can store electrical energy either in the electric field (capacitors) or the magnetic field (inductors). Switches can either be passive, voltage-controlled (diodes) or actively controlled switches (transistor or similar three terminal switches) and are responsible for either transferring power from the source to the storage element or from the storage element to the load. In some embodiments active devices (e.g., transistors, controllers, diodes, etc.) and passive devices (e.g., capacitors, inductors, transformers, etc.) can be selected and optimized for operation at temperatures less than 300 K and down to 1 K or less. In one embodiment gallium nitride transistors can be used in place of silicon transistors because of their improved characteristics (e.g., resistance between the drain and the source when biased on) at cryogenic temperatures and/or their efficiency at high voltages. In other embodiments superconducting inductors and silicon capacitors can be used because of improved characteristics at cryogenic temperatures.

In further embodiments Class 1 dielectrics (COG/NPO) and/or silicon capacitors/integrated passive devices can be used in the power conversion system. In various embodiments, for inductive devices, metal powder cores or non-magnetic (air) cores may be used. In various embodiments the inductor windings can be normal-conducting or super-conducting using NbTi/NbSn wires, BSSCO perovskite tapes or other superconducting materials. In some embodiments diodes can be silicon or GaAs Schottky junction diodes. In various embodiments switches can be GaN HEMT devices, bulk Si transistors or other types of devices.

In some embodiments one or more portions of the power conversion system illustrated in FIGS. 1-4 can be positioned within a cryogenic chamber stage and mounted to a platform that is configured to conduct heat generated by the power conversion system out to a cryogenic chamber stage or external environment that is further away (thermally) from the quantum computer.

In some embodiments, one or more portions of the power conversion system illustrated in FIGS. 1-4 can include an inductive power transfer system can inductively couple power from one stage of the cryogenic chamber to a colder stage of the cryogenic chamber or from the ambient environment to one or more stages of the cryogenic chamber such that improved thermal isolation can be achieved by not passing electrical conductors between cryogenic chamber stages. For example, an inductive power transfer system can include a power transmitting coil positioned outside of a cryogenic stage (such as stage 4 of FIG. 4) and a power receiving coil positioned within the cryogenic stage. A portion of the cryogenic chamber forming the stage (e.g., a portion of a wall such as a window insert) can be made from a material that is transmissive to inductively coupled power, such as for example glass, ceramic, plastic or other non-electrically conductive material. The power transmitting coil generate a time-varying electromagnetic field that can pass through the transmissive material to the power receiving coil.

The power receiving coil can generate a varying electrical signal (e.g., an AC signal) in response to being exposed to the time-varying electromagnetic field that propagates through the transmissive material. The AC signal can be coupled to a power conversion circuit that converts the received power (e.g., in an AC form) to DC power (or to an alternate form of AC power) that can be distributed to various circuits of the quantum computing device. In some embodiments to improve the efficiency of inductive power transfer all or at least a portion of a cryogenic chamber can be made from an inductively transparent material such as glass, ceramic or other material. Further, in some embodiments inductive transmission and receive coils can be nested within each other or otherwise arranged to maximize power transmission efficiency. One of skill in the art having the benefit of this disclosure will appreciate the many modifications and variations of inductively coupled energy system that could be used for power transfer and this disclosure is not limited to those described herein.

Figure 6:
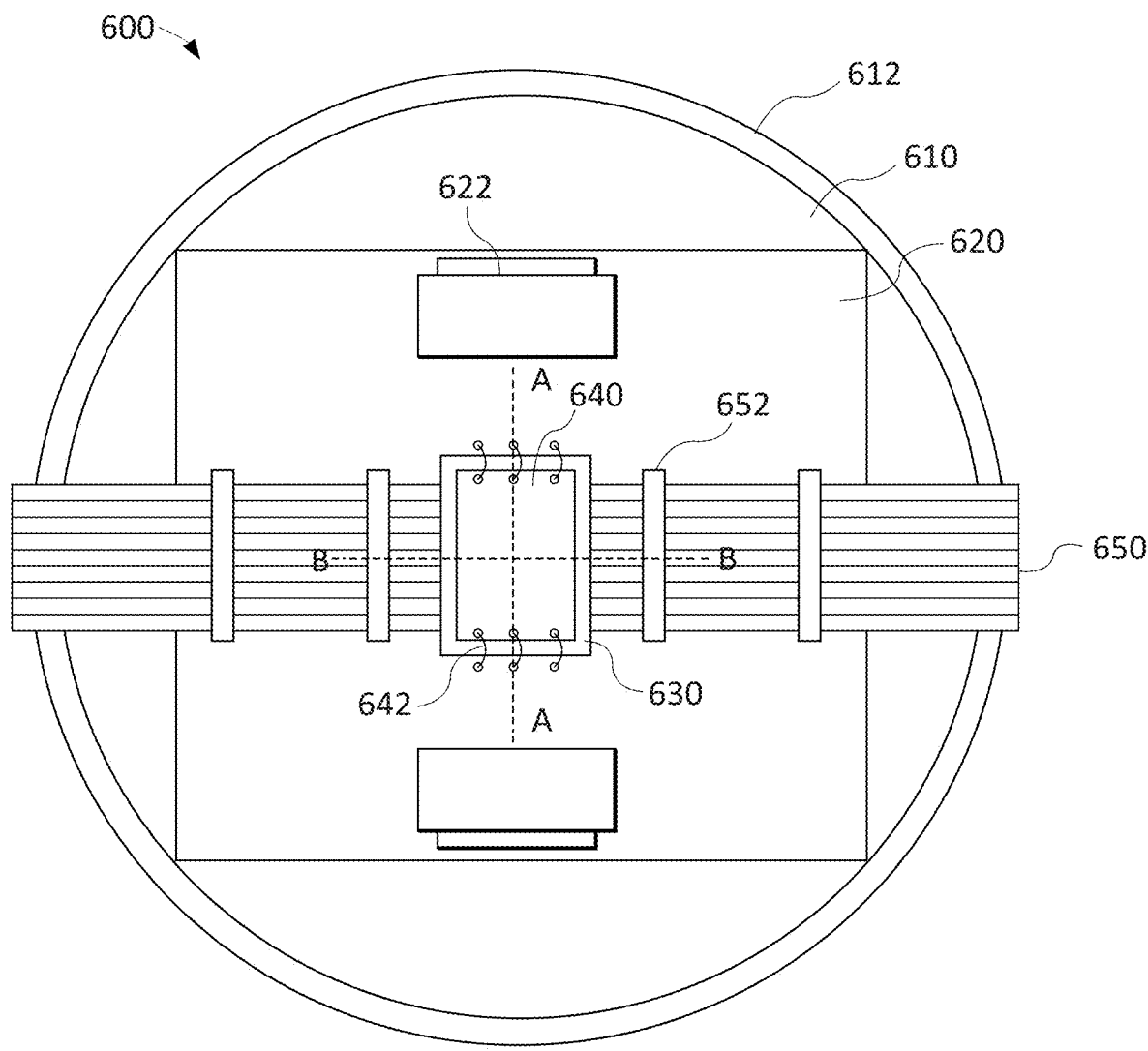
FIG. 6 is a top view of a quantum computing module, according to embodiments of the disclosure.

FIG. 6 is a top view of an example of a quantum computing module 600 that includes a QC die 630, an EC die 640, a circuit board (CB) 620, one or more electrical connectors 622, and optical fibers 650 on a silicon interposer wafer 610. Even though FIG. 6 only shows one QC/EC die stack, many QC/EC die stacks can be formed by, for example, bonding two wafers. As illustrated, a CB 620 is attached to silicon interposer wafer 610, e.g., using an epoxy or through fusion bonding or hybrid bonding, depending on the material of CB 620. As described above, one or more CBs 620 may be attached to silicon interposer wafer 610 at different horizontal or vertical locations. A QC/EC die stack includes EC die 640 bonded face-to-face with QC die 630 (e.g., by fusion bonding, hybrid bonding, solder ball, solder column or other interconnects) such that the QCs may directly face the ECs. CB 620 can be an organic laminate including one or more layers of metallic traces, however in other embodiments the CB can be any routing structure including, but not limited to one or more layers of silicon, ceramic (e.g., low-temperature co-fired ceramic, high-temperature co-fired ceramic, etc.), glass, organic or other insulative material with metallic traces that conduct electrical signals.

The QC/EC die stack may be bonded to silicon interposer wafer 610 by, for example, fusion bonding. EC die 640 may be electrically connected to CB 620 through wirebonds 642, where the bonding pads and bonding wires may only be at top (north) and bottom (south) sides of the QC/EC die stack. The left (west) and right (east) sides of the QC/EC die stack may be coupled with optical fibers 650, where optical fibers 650 may be attached to CB 620 through harnesses 652. As discussed in more detail above, CB 620 can include one or more power conversion circuits that generate one or more DC supply voltages that power the QC die and the EC die, as described in more detail below. CB 620 may also include electrical connectors 622 and some other electronic components, such as voltage regulators, power management ICs, decoupling capacitors, etc. A cooling device 612 (e.g., a cold head) may be attached to silicon interposer wafer 610 to cool the QC to low temperatures suitable for qubit generation, processing and/or detecting.

Figure 7:
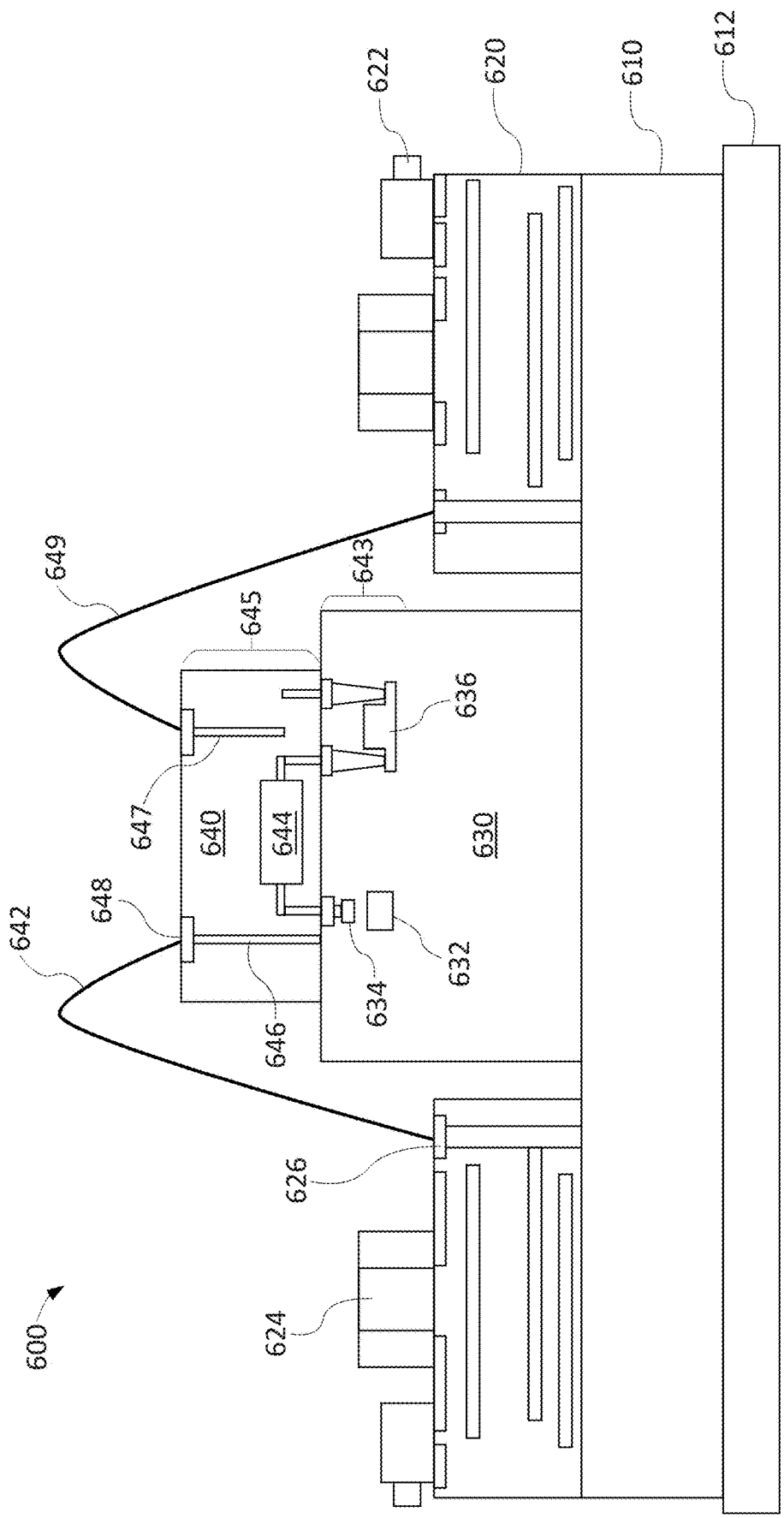
FIG. 7 is a cross-sectional view of the quantum computing module shown in FIG. 6.

FIG. 7 is a cross-sectional view of example quantum computing module 600 along line A-A shown in FIG. 6, according to certain embodiments. FIG. 7 shows that CB 620 and the QC 630/EC 640 die stack are bonded to a top surface of silicon interposer wafer 610. CB 620 may include multiple layers of interconnect traces or planes connected through vias. Electronic components, such as connector 622, decoupling capacitors 624, power control circuits, power management switches, diodes, capacitors, inductors, etc. may be soldered on the top surface of CB 620 or integrated within. CB 620 may also include solder pads 626 on the top surface of CB 620. QC die 630 includes a qubit integrated circuit 643 and is bonded directly to silicon interposer wafer 610 which is attached to cold head 612 to minimize a temperature of the qubit integrated circuit. In this particular embodiment, EC die 640 is bonded face-to-face with QC die 630 to minimize a length of the die to die interconnects. EC die 640 can include one or more electronic integrated circuits 645 that are electrically coupled to qubit integrated circuit 643.

In further embodiments QC die 630 and EC die 640 can be coupled face to face using fusion bonding, solder balls, solder columns solder pads, or any other suitable face to face interconnect structure. In other embodiments EC die 640 can be attached face up on QC die 630 and electrically coupled to the QC die with through silicon vias, die to die wirebonds or other suitable interconnects. Qubit integrated circuit 643 may include waveguides 632 and 636, and photodetectors 634, among other circuitry. Electronic integrated circuit 645 may include through-silicon vias (TSVs) 646, 647, control and/or logic circuits 644. Photodetector 634 (e.g., a single photon detector) may detect a single photon from waveguide 632, and send the detection result to control logic circuit 644, which may determine whether and how to tune waveguide 636 (e.g., to turn on or off an optical switch). EC die 640 may include redistribution layers (RDL) and bonding pads 648 on the top side (back side) of the die. Bonding pads 648 may be connected to control logic circuits 644 through TSVs 646, 647, and may also be connected to solder pads 626 on CB 620 through wirebonds 642.

In some embodiments a power conversion circuit (not shown in FIG. 7) can be integrally formed in CB 620 and can supply power to electronic integrated circuit 645 through wirebond 649 that is coupled to through silicon via 647. The power conversion circuit can also supply power to qubit integrated circuit 643 through wirebond 642 that is coupled to through silicon via 646 formed in EC die 640. Through silicon via 646 can be electrically coupled to qubit integrated circuit 643 via the face-to-face interconnects described above. In further embodiments one or more portions of the power conversion circuit can be integrally formed on EC die 640 to reduce electrical parasitics, improve transient response time and/or reduce part count/cost. As used herein, the term "through silicon via" encompasses vias such as through silicon via 646 that passes entirely through a die and blind vias such as through silicon via 647 that does not pass entirely through a die.

The materials and bonding techniques described herein can minimize the thermal resistance at the interfaces components, improve overall thermal conductivity, minimize thermal gradient, and match coefficients of thermal expansion (CTE), such that the package may allow qubit integrated circuit 643 to operate at cryogenic temperatures, such as below 10 K or below 5 K.

In another embodiment, CB 620 can extend across a top surface of EC die 640 and be attached to the EC die such that die stack of EC die 640 and QC die 630 are sandwiched between silicon interposer 610 and CB 620. Silicon interposer 610 can provide photonic coupling between a plurality of die stacks and CB 620 can provide electrical power, telemetry and control features to the plurality of die stacks. Silicon interposer 610 can be made from single or polycrystalline silicon and in some embodiments may be made from a different material such as, but not limited to sapphire, plastic or any other material.

Figure 8:
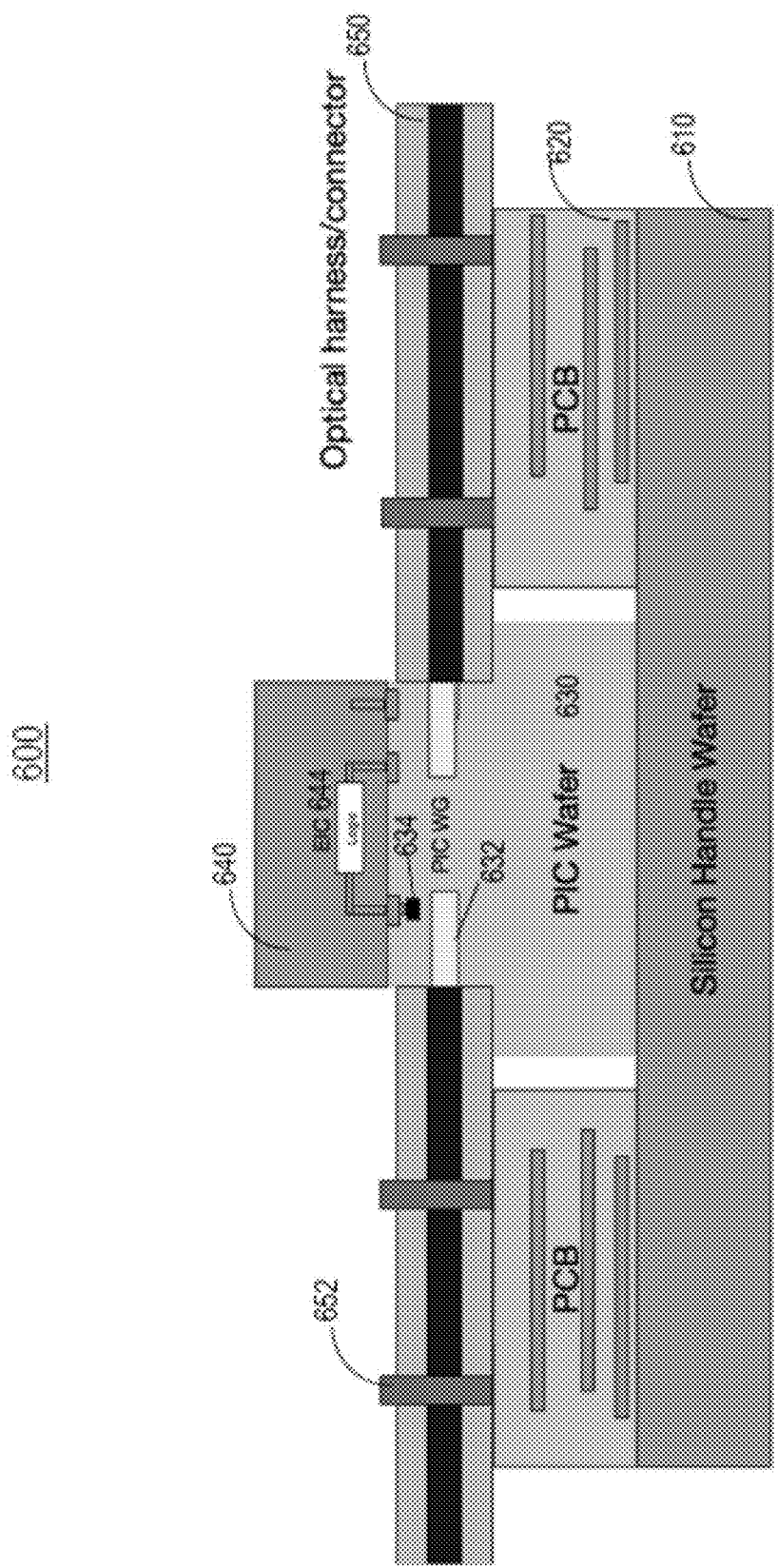
FIG. 8 is a cross-sectional view of the quantum computing module shown in FIG. 6.

FIG. 8 is another cross-sectional view of example quantum computing module 600 along line B-B shown in FIG. 6 according to certain embodiments. FIG. 8 shows that, in the B-B direction, optical fibers 650 may be attached to CB 620 through harnesses 652. Optical fibers 650 may fit in V-grooves formed on QC die 630, where the V-grooves may align with the waveguides on QC die 630. Therefore, when assembled, the cores of optical fibers may align with corresponding cores of the waveguides on QC die 630.

Figure 9:
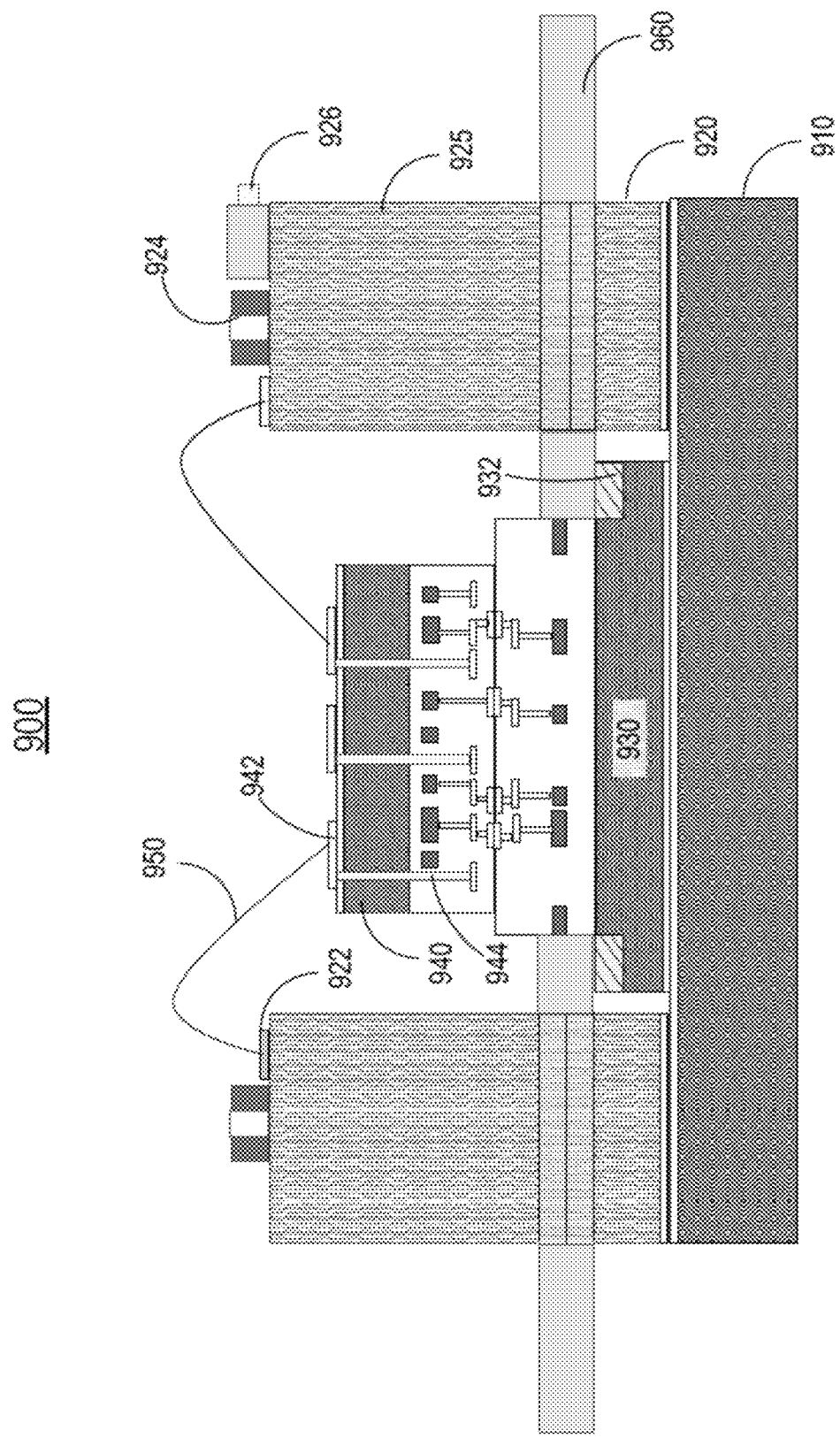
FIG. 9 is a cross-sectional view of a quantum computing module having an elevated circuit board, according to embodiments of the disclosure.

FIG. 9 is a cross-sectional view of an example quantum computing module 900 according to certain embodiments. Quantum computing module 900 may include a QC die 930, an EC die 940, and a CB 920 on a silicon interposer wafer 910. Even though FIG. 9 only shows one QC/EC die stack, many QC/EC die stacks can be formed for example, by bonding two wafers. As illustrated, CB 920 may be attached to silicon interposer wafer 910, e.g., using an epoxy or through fusion bonding or hybrid bonding, where the bonding method may depend on the material of CB 920. As described above, one or more CBs may be attached to silicon interposer wafer 910 at different horizontal or vertical locations. For example, a second CB 925 may be bonded on top of CB 920. CB 920 may also include electrical connectors 926 and some other electronic components, such as voltage regulators, power management ICs, decoupling capacitors 924, etc.

A QC/EC die stack may include EC die 940 bonded face-to-face with QC die 930 (e.g., by fusion bonding or hybrid bonding) such that the QCs may directly face the ECs. The QC/EC die stack may be bonded to silicon interposer wafer 910 by, for example, fusion bonding. EC die 940 may include bonding pads 942 on the back side of EC die 940, where bonding pads 942 may be connected to the electronic integrated circuits on EC die 940 through TSVs 944 as described above with respect to, for example, FIG. 7. EC die 940 may be electrically connected to CB 920 by bonding wires 950 which may connect bonding pads 922 on CB 925 and bonding pads 942 on the back side of EC die 940.

Optical fibers 960 may be attached to CB 920 and may fit in V-grooves 932 formed on QC die 930. V-grooves 932 may align with the waveguides on QC die 930. Therefore, when assembled, the cores of optical fibers 960 may align with corresponding cores of the waveguides on QC die 930. As shown in FIG. 9, optical fibers 960 may be sandwiched between and secured by CB 920 and CB 925. For example, optical fibers 960 may first be attached to CB 920 and fit in V-grooves 932 to align with waveguides on QC dies 930, and CB 925 may then be bonded on top of CB 920 and optical fibers 960 to secure optical fibers 960.

Figure 10:
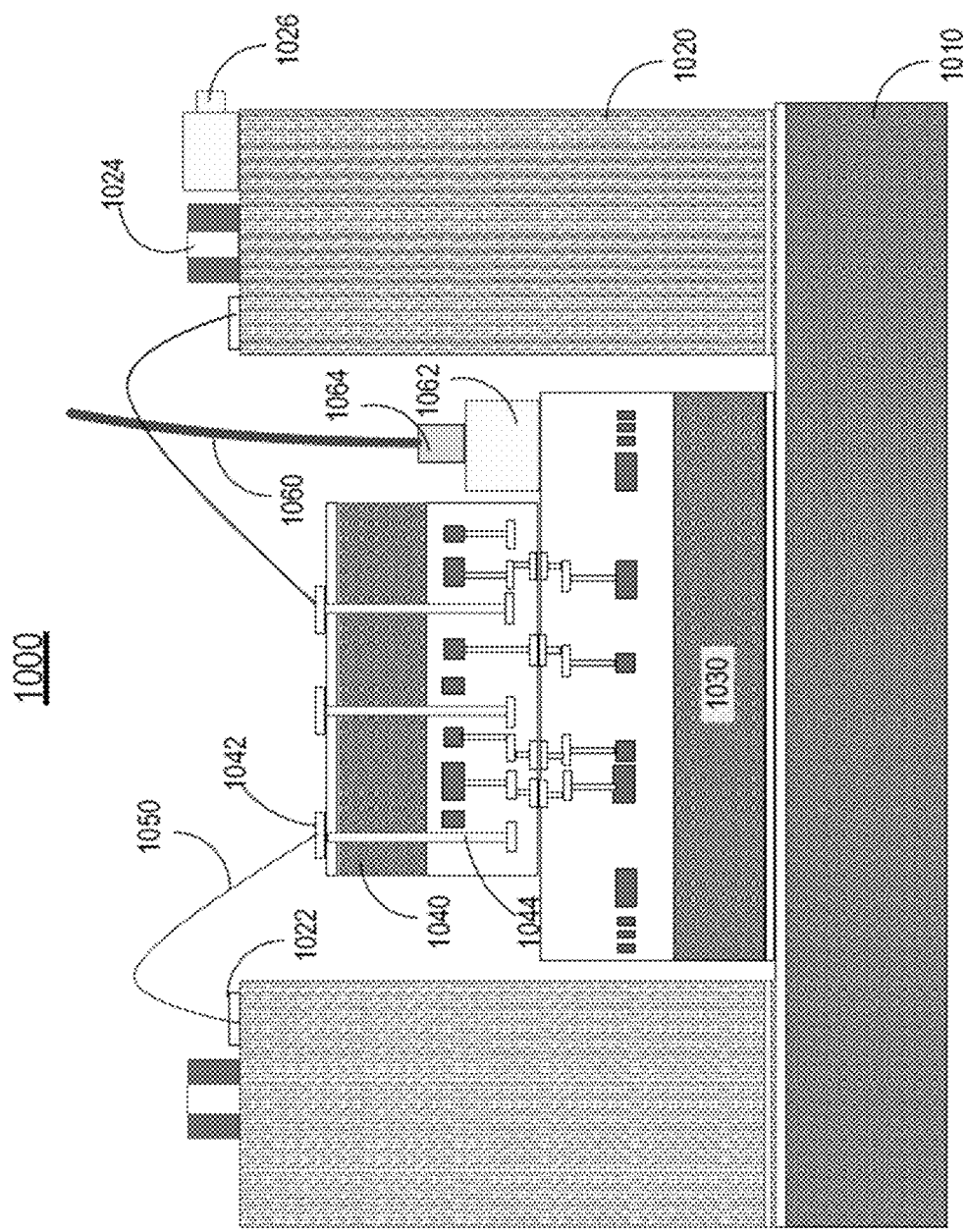
FIG. 10 is a cross-sectional view of a quantum computing module having a circuit board of increased thickness, according to embodiments of the disclosure.

FIG. 10 is a cross-sectional view of an example quantum computing module 1000 according to certain embodiments. Quantum computing module 1000 may include a QC die 1030, an EC die 1040, and a CB 1020 on a silicon interposer wafer 1010. Even though FIG. 10 only shows one QC/EC die stack, many QC/EC die stacks can be formed by bonding two wafers. As illustrated, CB 1020 may be attached to silicon interposer wafer 1010, e.g., using an epoxy or through fusion bonding or hybrid bonding, where the bonding method may depend on the material of CB 1020. CB 1020 may have a height or thickness less than, equal to, or greater than the height or thickness of a QC/EC die stack that includes EC die 1040 bonded with QC die 1030. CB 1020 may include electrical connectors 1026 and some other electronic components, such as voltage regulators, power management ICs, decoupling capacitors 1024, bonding pads 1022, etc.

EC die 1040 may be bonded face-to-face with QC die 1030 (e.g., by fusion bonding or hybrid bonding) such that the QCs may directly face the ECs to reduce the length the interconnects between the QCs and the ECs. The QC/EC die stack may be bonded to silicon interposer wafer 1010 by, for example, fusion bonding. EC die 1040 may include bonding pads 1042 on the back side of EC die 1040, where bonding pads 1042 may be connected to the electronic integrated circuits on EC die 1040 through TSVs 1044 as described above with respect to, for example, FIG. 7. EC die 1040 may be electrically connected to CB 1020 by bonding wires 1050, which may connect bonding pads 1022 on CB 1020 and bonding pads 1042 on the back side of EC die 1040.

As shown in FIG. 10, optical fibers 1060 may be vertically coupled to the QCs on QC die 1030 by one or more couplers 1062. Couplers 1062 may be bonded to QC die 1030 and aligned with the waveguides on QC die 1030. Optical fibers 1060 may each include a collimation lens 1064 (e.g., a GRIN lens or a micro-lens) on one end, and may be coupled to couplers 1062 for coupling light from optical fibers 1060 into the waveguides on QC die 1030.

Figure 11:
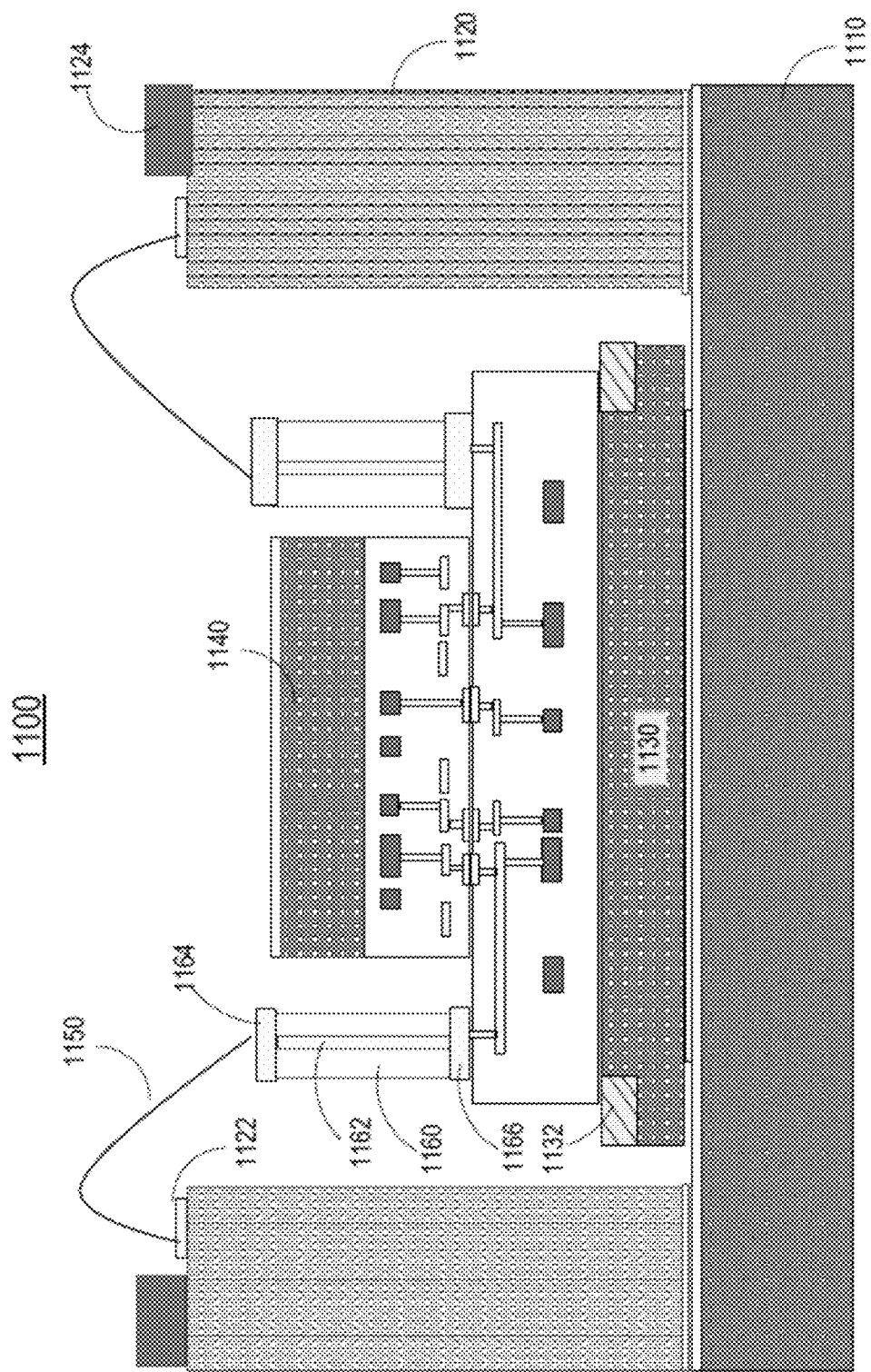
FIG. 11 is a cross-sectional view of a quantum computing module having a glass substrate with through glass vias for coupling power to the QC die, according to embodiments of the disclosure.

FIG. 11 is a cross-sectional view of an example package 1100 according to certain embodiments. Package 1100 may include a QC die 1130, an EC die 1140, and a CB 1120 on a silicon interposer wafer 1110. Even though FIG. 11 only shows one QC/EC die stack, many QC/EC die stacks can be formed. As illustrated, CB 1120 is attached to silicon interposer wafer 1110, e.g., using an epoxy or through fusion bonding or hybrid bonding. As described above, one or more CBs may be attached to silicon interposer wafer 1110 at different horizontal or vertical locations. For example, CB 1120 may include two or more CBs bonded vertically as described above with respect to, for example, FIG. 9. CB 1120 may also include some electronic components, such as voltage regulators, power management ICs, decoupling capacitors 1124, connectors, etc.

A QC/EC die stack may include EC die 1140 bonded face-to-face with QC die 1130 (e.g., by fusion bonding or hybrid bonding) such that the QCs may directly face the ECs. As described above, the QC/EC die stack may be bonded to silicon interposer wafer 1110 by, for example, fusion bonding. EC die 1140 may not include TSVs or bonding pads on the back side. Rather, a glass substrate 1160 with through glass vias (TGVs) 1162 may be bonded to QC die 1130. Contact pads 1166 on one side of glass substrate 1160 may be coupled to bonding pads 1164 on the other side of glass substrate 1160 through TGVs 1162. Contact pads 1166 may be coupled to the QCs on QC die 1130 and/or the ECs on EC die 1140. Bonding pads 1164 may be electrically connected to bonding pads 1122 on CB 1120 by bonding wires 1150. Using TGVs instead of TSVs may leave more silicon areas for the ECs, thus reducing the size of EC dies 1040. In addition, without TSVs on EC die 1140, the processing steps for manufacturing the EC die 1140 may be significantly reduced, and thus may further reduce the cost of manufacturing the EC die 1140. Furthermore, glass (e.g., silicon dioxide) may be a better insulator than silicon, and thus the TGVs may have lower RC losses than TSVs.

Optical fibers may be attached to CB 1120 and may fit in V-grooves 1132 formed on QC die 1130. V-grooves 1132 may align with the waveguides on QC die 1130. Therefore, when assembled, the cores of the optical fibers in V-grooves 1132 may align with corresponding cores of the waveguides on QC die 1130. As described above with respect to FIG. 9, the optical fibers may be sandwiched between and secured by CB 1120.

The above described techniques can be used to assemble or package other circuits for the desired thermal and electrical performance. For example, the techniques can also be used to package one or more silicon ICs on silicon-based package substrate, or package one or more ICs on non-silicon package substrates.

Although not shown in some of the figures, in some embodiments, a cooling device (e.g., a cold head 612 shown in FIG. 7) may be attached to the silicon interposer wafer (e.g., silicon interposer wafer 610, 910, 1010, or 1110, also known as a silicon substrate) to cool down the QCs and/or the ECs such that the QCs or the ECs may work at the desired temperature, such as cryogenic temperature.

In some embodiments, the qubits that are sometimes described as photons herein can be a collection of quantum systems and/or particles and can be formed using any qubit architecture. For example, the quantum systems can be particles such as atoms, ions, nuclei, and/or photons. In other examples, the quantum systems can be other engineered quantum systems such as flux qubits, phase qubits, or charge qubits (e.g., formed from a superconducting Josephson junction), topological qubits (e.g., majorana fermions), or spin qubits formed from vacancy centers (e.g., nitrogen vacancies in diamond). Furthermore, for the sake of clarity of description, the term "qubit" is used herein although the system can also employ quantum information carriers that encode information in a manner that is not necessarily associated with a binary bit. For example, qudits (i.e., quantum systems that can encode information in more than two quantum states) can be used in accordance with some embodiments.

It will be apparent to those skilled in the art that substantial variations may be made in accordance with specific implementations. For example, customized hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The terms "machine-readable medium" and "computer-readable medium" as used herein refer to any storage medium that participates in providing data that causes a machine to operate in a specific fashion. In embodiments provided hereinabove, various machine-readable media might be involved in providing instructions/code to processors and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media, punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code.

The methods, systems, and devices discussed herein are examples. Various embodiments may omit, substitute, or add various procedures or components as appropriate. For instance, features described with respect to certain embodiments may be combined in various other embodiments. Different aspects and elements of the embodiments may be combined in a similar manner. The various components of the figures provided herein can be embodied in hardware and/or software. Also, technology evolves and, thus, many of the elements are examples that do not limit the scope of the disclosure to those specific examples.

It has proven convenient at times, principally for reasons of common usage, to refer to such signals as bits, information, values, elements, symbols, characters, variables, terms, numbers, numerals, or the like. It should be understood, however, that all of these or similar terms are to be associated with appropriate physical quantities and are merely convenient labels. Unless specifically stated otherwise, as is apparent from the discussion above, it is appreciated that throughout this specification discussions utilizing terms such as "processing," "computing," "calculating," "determining," "ascertaining," "identifying," "associating," "measuring," "performing," or the like refer to actions or processes of a specific apparatus, such as a special purpose computer or a similar special purpose electronic computing device. In the context of this specification, therefore, a special purpose computer or a similar special purpose electronic computing device is capable of manipulating or transforming signals, typically represented as physical electronic, electrical, or magnetic quantities within memories, registers, or other information storage devices, transmission devices, or display devices of the special purpose computer or similar special purpose electronic computing device.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms "and," "or," and "an/or," as used herein, may include a variety of meanings that also is expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics.

However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, B, C, AB, AC, BC, AA, AAB, ABC, AABBCCC, etc.

Reference throughout this specification to "one example," "an example," "certain examples," or "exemplary implementation" means that a particular feature, structure, or characteristic described in connection with the feature and/or example may be included in at least one feature and/or example of claimed subject matter. Thus, the appearances of the phrase "in one example," "an example," "in certain examples," "in certain implementations," or other like phrases in various places throughout this specification are not necessarily all referring to the same feature, example, and/or limitation. Furthermore, the particular features, structures, or characteristics may be combined in one or more examples and/or features.

In some implementations, operations or processing may involve physical manipulation of physical quantities. Typically, although not necessarily, such quantities may take the form of electrical or magnetic signals capable of being stored, transferred, combined, compared, or otherwise manipulated. It has proven convenient at times, principally for reasons of common usage, to refer to such signals as bits, data, values, elements, symbols, characters, terms, numbers, numerals, or the like. It should be understood, however, that all of these or similar terms are to be associated with appropriate physical quantities and are merely convenient labels. Unless specifically stated otherwise, as apparent from the discussion herein, it is appreciated that throughout this specification discussions utilizing terms such as "processing," "computing," "calculating," "determining," or the like refer to actions or processes of a specific apparatus, such as a special purpose computer, special purpose computing apparatus or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

In the preceding detailed description, numerous specific details have been set forth to provide a thorough understanding of claimed subject matter. However, it will be understood by those skilled in the art that claimed subject matter may be practiced without these specific details. In other instances, methods and apparatuses that would be known by one of ordinary skill have not been described in detail so as not to obscure claimed subject matter. Therefore, it is intended that claimed subject matter not be limited to the particular examples disclosed, but that such claimed subject matter may also include all aspects falling within the scope of appended claims, and equivalents thereof.

For an implementation involving firmware and/or software, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable storage medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, compact disc read-only memory (CD-ROM) or other optical disk storage, magnetic disk storage, semiconductor storage, or other storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer-readable storage medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims. That is, the communication apparatus includes transmission media with signals indicative of information to perform disclosed functions. At a first time, the transmission media included in the communication apparatus may include a first portion of the information to perform the disclosed functions, while at a second time the transmission media included in the communication apparatus may include a second portion of the information to perform the disclosed functions.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

What is claimed is:

1. A device comprising:
a cryogenic chamber; and
a quantum computing module positioned within the cryogenic chamber and including:
a silicon substrate;
a quantum circuit (QC) die including a qubit integrated circuit, the QC die attached to the silicon substrate;
an electronic circuit (EC) die including an electronic integrated circuit, the EC die attached to the QC die such that the qubit integrated circuit and the electronic integrated circuit face each other; and
a circuit board (CB) including a power converter configured to convert input power received from a cryogenic chamber feedthrough to output power that is coupled to the QC die and to the EC die.

2. The device of claim 1 wherein the power converter supplies the output power to the QC die through the EC die.

3. The device of claim 2 wherein the EC die includes at least one through silicon via that couples the output power from the power converter to the QC die.

4. The device of claim 2 wherein the EC die includes at least one through silicon via that couples the output power from the power converter to the electronic integrated circuit.

5. The device of claim 1 wherein the QC die and the EC die are fusion bonded together.

6. The device of claim 1 wherein the quantum circuit die is a photonic integrated circuit.

7. The device of claim 1 wherein the CB is physically coupled to the silicon substrate.

8. The device of claim 1 wherein the CB is physically coupled to the EC die.

9. A device comprising:
a cryogenic chamber;
a power source positioned outside of the cryogenic chamber;
a feedthrough positioned within a wall of the cryogenic chamber; and
a quantum module positioned within the cryogenic chamber and including:
a silicon substrate;
a quantum circuit (QC) die including a qubit integrated circuit, the QC die attached to the silicon substrate; and
an electronic circuit (EC) die including an electronic integrated circuit electrically coupled to the qubit integrated circuit, the EC die physically attached to the QC die; and
a circuit board (CB) including a power converter configured to convert input power received from the feedthrough to one or more DC voltages that are electrically coupled to the qubit integrated circuit and to the electronic integrated circuit.

10. The device of claim 9 wherein the power converter supplies the one or more DC voltages to the qubit integrated circuit die through the EC die.

11. The device of claim 10 wherein the EC die includes at least one through silicon via that couples at least one of the one or more DC voltages from the power converter to the qubit integrated circuit.

12. The device of claim 10 wherein the EC die includes at least one through silicon via that couples at least one of the one or more DC voltages from the power converter to the electronic integrated circuit.

13. The device of claim 9 wherein the QC die and the EC die are fusion bonded together.

14. The device of claim 9 wherein the quantum circuit die is a photonic integrated circuit.

15. The device of claim 9 wherein the CB is physically coupled to the silicon substrate.

16. The device of claim 9 wherein the CB is physically coupled to the EC die.

17. A method comprising:
coupling electrical power into a cryogenic chamber through a feedthrough;
converting the electrical power to one or more DC voltages with a power converter positioned within the cryogenic chamber; and
operating a quantum module positioned within the cryogenic chamber using the one or more DC voltages, the quantum module including:
a silicon substrate;
a quantum circuit (QC) die including a qubit integrated circuit, the QC die attached to the silicon substrate; and
an electronic circuit (EC) die including an electronic integrated circuit electrically coupled to the qubit integrated circuit, the EC die physically attached to the QC die; and
a circuit board (CB).

18. The method of claim 17 wherein the power converter is formed on the CB.

19. The method of claim 17 wherein the power converter is coupled to the QC die through the EC die.

20. The method of claim 19 wherein the EC die includes at least one through silicon via that couples the electrical power from the power converter to the qubit integrated circuit.

* * * * *